United States Patent
Hosseini et al.

(10) Patent No.: US 7,874,475 B2
(45) Date of Patent: Jan. 25, 2011

(54) METHOD FOR THE PLANAR JOINING OF COMPONENTS OF SEMICONDUCTOR DEVICES AND A DIFFUSION JOINING STRUCTURE

(75) Inventors: Khalil Hosseini, Weihmichl (DE); Joachim Mahler, Regensburg (DE); Edmund Riedl, Obertraubling-Gebelkofen (DE); Ivan Galesic, Regensburg (DE); Konrad Roesl, Teublitz (DE)

(73) Assignee: Infineon Technologies AG, Munich (DE)

( * ) Notice: Subject to any disclaimer, the term of this patent is extended or adjusted under 35 U.S.C. 154(b) by 666 days.

(21) Appl. No.: 11/635,064

(22) Filed: Dec. 7, 2006

(65) Prior Publication Data

US 2007/0131734 A1  Jun. 14, 2007

(30) Foreign Application Priority Data

Dec. 7, 2005  (DE) .................... 10 2005 058 654

(51) Int. Cl.
*B23K 28/00* (2006.01)
(52) U.S. Cl. ...................................... 228/254; 228/193
(58) Field of Classification Search . 228/179.1–180.22, 228/193–195, 225–226, 245–262
See application file for complete search history.

(56) References Cited

U.S. PATENT DOCUMENTS

| | | | | |
|---|---|---|---|---|
| 2,936,365 A | * | 5/1960 | Niemi | ......................... 219/138 |
| 3,180,022 A | * | 4/1965 | Briggs et al. | ........... 228/262.51 |
| 3,698,080 A | * | 10/1972 | Berner | ........................ 438/109 |
| 3,761,309 A | * | 9/1973 | Schmitter et al. | ........... 428/600 |
| 4,122,992 A | * | 10/1978 | Duvall et al. | ................. 228/176 |
| 4,392,153 A | * | 7/1983 | Glascock et al. | ............. 257/746 |
| 5,242,099 A | | 9/1993 | Ueda | |
| 5,801,084 A | * | 9/1998 | Beasom et al. | ............... 438/457 |
| 5,876,795 A | * | 3/1999 | Goldsmith et al. | ........... 427/226 |
| 6,334,567 B1 | | 1/2002 | Zie et al. | |
| 2003/0116840 A1 | * | 6/2003 | Hacke et al. | ................. 257/678 |
| 2004/0262370 A1 | * | 12/2004 | Ano | ....................... 228/180.21 |

FOREIGN PATENT DOCUMENTS

| | | | |
|---|---|---|---|
| DE | 19532250 A1 | | 3/1997 |
| DE | 10339462 A1 | | 3/2005 |
| JP | 60189465 A | * | 9/1985 |
| WO | WO 2004/088725 A2 | | 10/2004 |
| WO | WO 2006/060981 A1 | | 6/2006 |
| WO | WO 03/072288 A1 | | 9/2006 |

* cited by examiner

*Primary Examiner*—Emily M Le
*Assistant Examiner*—Megha Mehta
(74) *Attorney, Agent, or Firm*—Edell, Shapiro & Finnan, LLC

(57) ABSTRACT

A method for the planar joining of components of semiconductor devices involves coating the components with diffusion materials on their upper sides and rear sides, respectively. Subsequently, the components to be joined one on the other are introduced into a reducing atmosphere. The components are aligned and a compressive pressure is exerted on the aligned components. While heating up the components to be joined in the reducing atmosphere to a diffusion joining temperature, isothermal solidification takes place, the diffusion joining temperature lying below the melting temperature of the forming diffusion joint of the joined material.

20 Claims, 6 Drawing Sheets

METHOD FOR THE PLANAR JOINING OF COMPONENTS OF SEMICONDUCTOR DEVICES AND A DIFFUSION JOINING STRUCTURE

CROSS REFERENCE TO RELATED APPLICATIONS

This application claims priority under 35 U.S.C. §119 to Application No. DE 102005058654.6 filed on Dec. 7, 2005, entitled "Method for the Planar Joining of Components of Semiconductor Devices," the entire contents of which are hereby incorporated by reference.

BACKGROUND

A known method relates to diffusion soldered connections, used for producing a thermally stable connection via diffusion joining. For this purpose, a first body is coated with a high-melting metal and a second body is coated with a low-melting metal. Then the two bodies can be joined at a given temperature and a given contact pressure via a diffusion soldered connection. High-melting intermetallic phases thereby form, the melting points of which are higher than the melting point of the low-melting metal. With the known joining method, individual joining locations of an electronic power device can be produced in a thermally stable manner.

However, an electronic power semiconductor device has a number of joining locations, which are created by multistage methods. For this purpose, another known method relates to the multistage production of diffusion soldered connections for power semiconductor devices with semiconductor chips. For this purpose, diffusion joining of a rear side of a semiconductor chip to a chip island of a substrate is established by a first diffusion joint and diffusion joining of an upper side of a semiconductor chip to wiring patterns of a further substrate is established by a further diffusion joint, the diffusion joints having different melting temperatures on account of different intermetallic phases that are formed.

In the case of the known diffusion soldering methods, often an excess of low-melting joining components, such as tin, is used, while the high-melting components, such as gold and/or palladium, are given in exact volumes. Such diffusion soldering methods have the disadvantage that excess low-melting joining components put at risk the reliability and heat resistance of the diffusion joints. Another risk is that the intermetallic phases extend so far in the diffusion joint that the ductility of the diffusion joint is reduced and the brittleness predominates in an inadmissible way, such that there is an increased risk of damage, in particular the development of microcracks, under exposure to changing temperatures, with an increase in the transfer resistance of the diffusion joint.

Figure 9:
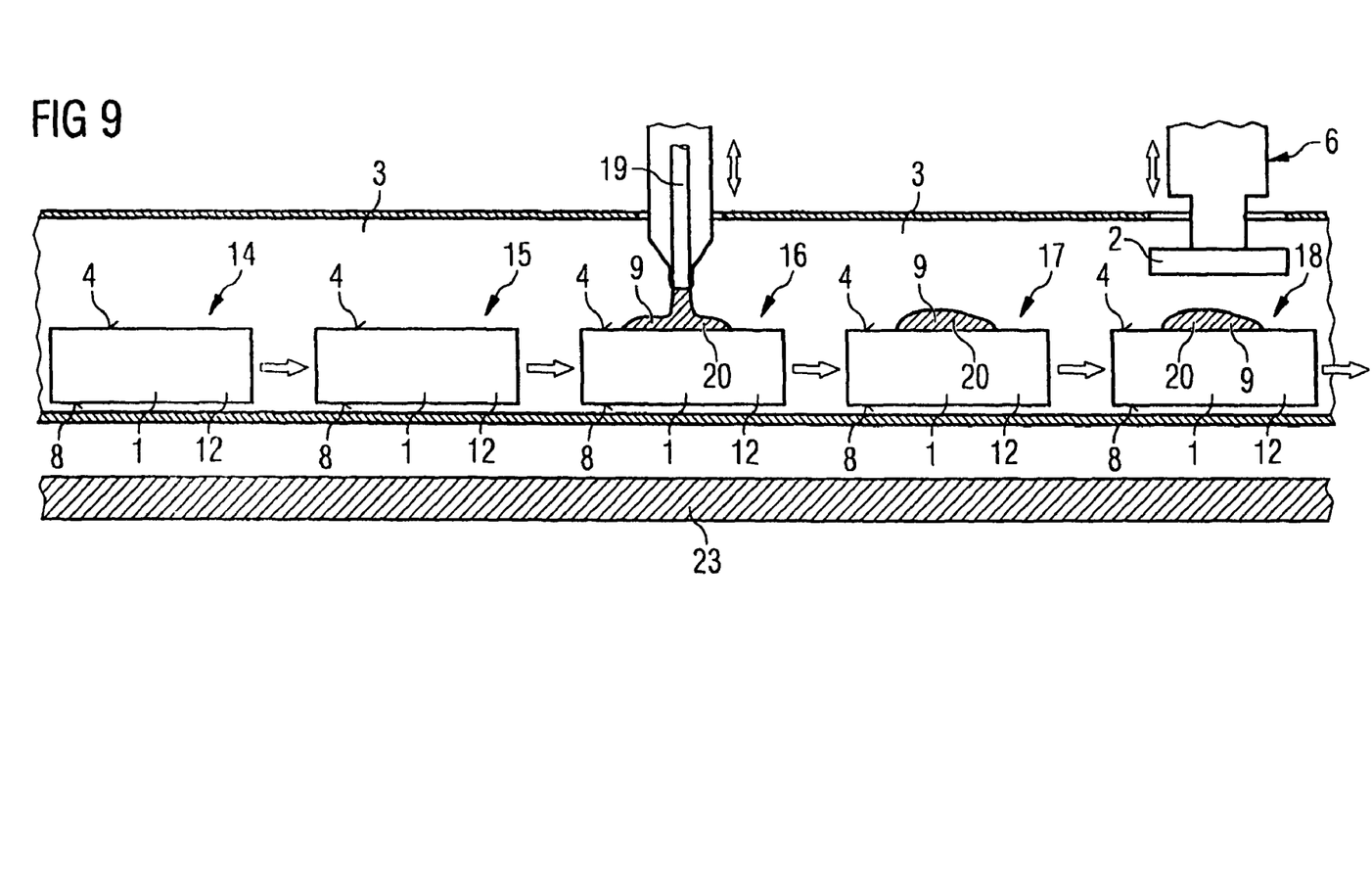
FIG. 9 shows a basic diagram of an apparatus for carrying out a known method for the joining of components of a power semiconductor device.

A conventional method for the planar joining of a rear side of a power semiconductor chip to a large-area rear-side electrode of a semiconductor chip island which has a copper heat sink is shown by FIG. 9. Firstly, the surface 4 of the copper heat sink, as a substrate or base component 1 of a semiconductor device, is cleaned in first cleaning positions 14 and 15 at an elevated temperature by reduction in a reducing atmosphere 3 of forming gas with 5% by volume of hydrogen, the remainder nitrogen. In a joining material coating position 16, a wire 19 of joining material is lowered onto the upper side 4 of the copper heat sink, and a joining material melt 20 is applied while wetting the upper side.

The joining material melt 20 is reduced in a further heating position 17 and fed to a joining position 18. In the joining position 18, a power semiconductor chip is lowered onto the joining material melt 20 as the component 2 to be joined. The joining material melt 20 is thereby deformed into a virtually rectangular base area while wetting the metallization on the rear side of the chip. The power semiconductor chip is kept adjusted until the liquid metal phases and alloys have cooled and solidified under interdiffusion and alloy formation between the joining material melt and the material of the copper heat sink and also between the joining material melt and the metallization on the rear side of the chip.

This known way of conducting the process according to FIG. 9 has the following disadvantages and risks.

1. An oxidation of the metal melt in the time between the melting process and the lowering of the power semiconductor chip leads to wetting problems;

2. An inadequate joining material thickness under the corners and edges of the chip as a result of poor positioning of the solder material wetting and non-adapted form of the solder melt leads to reliability risks;

3. A tilting of the chip by a sea of melt leads to process problems in subsequent wire bonding processes, in particular with regard to adjustment and contact area detection, which likewise entails reliability risks;

4. Voids in the joining joint reduce the thermal conductivity and limit the electrical energy that can be handled or switched in a power semiconductor device. Such voids are produced by two previously known effects:

a—wetting defects at the boundary surfaces of the upper side of the heat sink to the joining material and the joining material to the rear side of the power semiconductor chip; and b—creation of voids during lengthy thermal exposure of the joining joint on account of phase growth and increases in the size of crystalline grains; and 5. A strongly pressed-out joining material limits the size of the semiconductor chip or the size of the contact terminal area for special packages, since the joining material extends beyond the sides to be joined.

SUMMARY

A method described herein relates to the planar joining of components of semiconductor devices. The components to be joined are coated with diffusion materials on their upper sides and rear sides, respectively. Subsequently, the components to be joined one on the other are introduced into a reducing atmosphere. The components are aligned and a compressive pressure is exerted on the aligned components. While heating up the components to be joined in the reducing atmosphere to a diffusion joining temperature, isothermal solidification takes place, the diffusion joining temperature lying below the melting temperature of the forming diffusion joint of the joined material.

The above and still further features and advantages of the method and device will become apparent upon consideration of the following definitions, descriptions and descriptive figures of specific embodiments thereof, wherein like reference numerals in the various figures are utilized to designate like components. While these descriptions go into specific details of the method and device, it should be understood that variations may and do exist and would be apparent to those skilled in the art based on the descriptions herein.

BRIEF DESCRIPTION OF THE DRAWINGS

The method is explained in more detail below with reference to exemplary embodiments, where:

FIGS. 2 to 4 show schematic cross sections through components when joining the components;

DETAILED DESCRIPTION

A method for the planar joining of components of semiconductor devices includes the following operations. First, the components of semiconductor devices that are to be joined are provided, for their part including sides to be joined. The base component has an upper side and the component to be joined on the base has a rear side. Layers of joining material are applied to the upper side and/or to the rear side of the components to be joined, the layers being applied to semiconductor wafers and/or semiconductor chip carriers before the latter are divided up into individual components of semiconductor devices.

The components to be joined one on the other may then be introduced into a reducing atmosphere. In a corresponding joining position, the base component and the component to be joined are aligned one on the other and brought together. In addition, a compressive pressure is mechanically exerted on the aligned components. The components pressed one on the other are at the same time heated up in the reducing atmosphere to a diffusion joining temperature for isothermal solidification, which is carried out below the melting temperature of the joined material.

Advantages of this method include:

1. Depositing the joining material on semiconductor wafers and/or semiconductor chip carriers before they are divided up into individual components of semiconductor devices achieves the effect that the joining material forms a uniform, large-area coating, such that inadequate and/or non-uniform layer thicknesses at the corners and edges of the power semiconductor chips is avoided.

2. While the force of the compressive pressure is acting, the low-melting metal phase alloys with the adjacent metal surfaces, thereby forming intermetallic phases at a melting point above the process temperature and isothermal solidification occurs.

3. Diffusion of the joining material at the boundary surface with the higher-melting substrate metal or metal on the rear side causes the formation of intermetallic phases of a binary and/or ternary system between the joining material and the substrate material or the joining material and the metallization on the rear side.

4. If the joining material already has an alloy, intermetallic phases of the corresponding multicomponent system can form. This process also occurs for the boundary surfaces of the semiconductor chip to the joining material if the joining material contains a corresponding reservoir of alloying metals.

5. Furthermore, depositing of joining material on a semiconductor wafer of the component to be joined and the full-area compressive pressure on the semiconductor chip during the diffusion joining process achieve the effect of improved attachment of the edges and corners of the chips in the case of large power semiconductor chips as compared with the conventional method.

6. Since no pre-wetting of the sides of the components that are to be joined, as carried out in the known method, takes place during the joining process, there is a lower void rate in comparison with the conventional joining of semiconductor components.

7. The application of the layers simultaneously achieves the effect of a diffusion joint thickness that can be predetermined and lower by a factor of about 10 as compared to that of conventional methods. Furthermore, an associated significant reduction in the thermal resistance is realized.

8. Diffusion joining has the general advantage that, if the components to be joined pass through the bonding machine more than once, there is no re-melting of the diffusion joining material.

9. The isothermal solidification with the formation of intermetallic phases and the pressing out of excess low-melting material and the low void rate have the combined effect that the finished joining result has a greater mechanical, electrical and thermal capability than that of the conventionally produced joint.

In a preferred embodiment of the method, the compressive pressure is exerted on the components to be joined over their full surface area. In other words, the compressive pressure is applied and distributed across an entire surface area of a side of each of the components. A mechanically and thermally stable tool is used for this purpose. A clamp is preferably used for applying the compressive pressure, arranged with one leg flat on the upper side of the components to be joined and with a second leg on the rear side of the base component, and a spring element region arranged between the legs, the spring element including a thermally stable spring constantly pressing the legs of the clamp one against the other.

This variant of the method has the associated advantage that the components to be joined can be mounted and brought one onto the other even before introduction into a reducing atmosphere. Only after passing through a flow-through furnace filled with reducing atmosphere are the clamps removed. Such a process can be carried out in a fully automatic fashion which is suitable for mass production.

In a further preferred embodiment of the method, lead-free solders, preferably one of the multicomponent systems with Sn—Ag alloys or In—Ag alloys or Au—Sn alloys with reservoirs in the form of Ag, Cu or Ni layers, are used as the diffusion joining materials. If in this case the melting point of materials lies below the joined material, such excess materials may be pressed out of the diffusion joint on account of the compressive pressure, such that during the subsequent removal of the compressive force only high-melting metal phases exist along the connecting line between the base component and the component to be joined. This has the advantage that the risk of microcracks forming under exposure to changing temperatures is reduced.

In a further preferred embodiment of the method, the diffusion joining time is shortened to a few seconds as a result of the compressive pressure. Therefore, at the same time that the layer thickness of the diffusion joint or the layer thickness of the region in which intermetallic phases form is so small that the brittleness of the intermetallic phases does not have any adverse effect on the ductility of the overall diffusion joint comprising layers with ductile metals and ductile metal alloys. In this case, the thickness d of the diffusion joint corresponds to the sum of the extent of the thickness of the intermetallic phases forming and the thicknesses of layers for which the melting point lies above the diffusion joining temperature. The metallic phase, which only forms between the contact or boundary surfaces of the outer coatings of the components to be joined, has a thickness $d_1$ in micrometers of $1~\mu m \leq d_I \leq 1.5~\mu m$ during the compression diffusion joining.

Semiconductor chips are preferably applied as semiconductor components to semiconductor chip positions of a semiconductor wafer, in this variant of the method the semiconductor wafer initially remaining intact and the semiconductor chip positions forming the base components. This method requires an apparatus with which semiconductor chips can be applied as a base component to semiconductor wafers in the semiconductor chip positions before a semiconductor wafer is divided up.

In a further embodiment of the method, power semiconductor chips are applied as semiconductor components to semiconductor chip positions of a highly doped semiconductor wafer. Likewise, thinned power semiconductor chips may also be applied as semiconductor components to corresponding semiconductor chip positions of a highly doped semiconductor wafer. Accordingly, after application and establishment of the diffusion joint in the individual semiconductor chip positions of a semiconductor wafer, the semiconductor wafer can be divided, such that a CoC (Chip on Chip) device is produced.

Preferably, individual power semiconductor chips are stacked one on the other as semiconductor components, the base component being formed by one of the power semiconductor chips and the component to be stacked being formed by a second power semiconductor chip. In the embodiment of the method, although the power semiconductor chip is still coated as a power semiconductor wafer with the corresponding sequences of layers for a diffusion coating, these semiconductor wafers with power semiconductor chips are subsequently divided up in the semiconductor chip positions and then correspondingly a power semiconductor chip is stacked on a power semiconductor chip, one on the other, at a corresponding diffusion joint.

Furthermore, it is also possible that power semiconductor chips are applied as semiconductor components to a circuit carrier. Such circuit carriers may be leadframes which include a number of semiconductor device positions arranged one behind the other in a row, the power semiconductor chips being applied on a central chip plane of the leadframe via a first diffusion joining method and at least one further power semiconductor chip being applied to the already joined semiconductor chip via a further diffusion joining method.

The coating of the rear side of a semiconductor wafer with diffusion joining material may be performed via thin-film depositing methods, such as, e.g., the sputtering method, the vapor-depositing method or chemical depositing from a gas phase. The advantage of this preparation of the rear side of semiconductor wafers before components obtained from the semiconductor wafer are correspondingly diffusion-joined one on the other lies in the relatively planar and uniform distribution of the diffusion joining material on the rear sides of the individual power semiconductor chips then obtained.

In a further preferred embodiment of the method, a buildup of layers is deposited on the upper side of the base component, including: a copper layer with a thickness $d_{Cu}$ in micrometers of $10~\mu m \leq d_{Cu} \leq 20~\mu m$, a nickel/phosphorus layer with a phosphorus content $V_{Ph}$ of 3% by volume $\leq V_{Ph} \leq 8\%$ by volume and a thickness $d_{NiP}$ of $2~\mu m \leq d_{NiP} \leq 5~\mu m$, a palladium layer with a thickness $d_{Pa}$ in nanometers of $100~nm \leq d_{Pa} \leq 500~nm$ and a gold layer with a thickness $d_G$ of $40~nm \leq d_G \leq 100~nm$, wherein the copper layer is applied first and the gold layer is applied at the end.

Likewise, a buildup of layers is deposited on the rear side of the component to be joined, the layers including: an aluminum layer with a thickness $d_{Al}$ in nanometers of $400~nm \leq d_{Al} \leq 800~nm$, a first titanium layer with a thickness $d_{Ti1}$ of $400~nm \leq d_{Ti1} \leq 800~nm$, a nickel layer with a thickness $d_{Ni}$ of $50~nm \leq dNi \leq 100~nm$, a second titanium layer with a thickness $d_{Ti2}$ of $2~nm \leq d_{Ti2} \leq 5~nm$, a silver layer with a thickness $d_{Ag}$ of $100~nm \leq d_{Ag} \leq 1000~nm$ and a gold/tin layer with 80Au/20Sn and a thickness $d_{GSn}$ in micrometers of $0.9~\mu m \leq d_{GSn} \leq 2.0~\mu m$, wherein the aluminum layer is applied first and the gold/tin layer is applied at the end.

By building up the layers of material described above on the upper side of the base component and on the rear side of the component to be joined, it is possible to solve the previous problems in the planar joining of components of semiconductor devices via diffusion joining. The material diffusion between the AuSn phase and the NiP/Pd/Au layers has the effect that, between the contact surfaces of AuSn and PdAu, intermetallic AuSnPd phases form, which after solidification ensure stable contact for temperatures above 300° C.

This embodiment has the associated advantage that the use of this precise buildup of layers achieves a high thermal stability of greater than 300° C. for different connecting technologies. In addition, the connecting technology formed via this embodiment, of diffusion joining comprising the buildup of layers as mentioned above, is distinguished by high mechanical strength, even under exposure to changing temperatures, and a great thermal and electrical capability. One advantage lies in the use of lead-free diffusion joining materials with AuSn on Cu/Ni/Pd/Au metallizations.

The diffusion joining between the two materials on the upper side of the base component and the rear side of the component to be stacked takes place when heating up the two power semiconductor chips placed one on the other between the semiconductor chip to be stacked and the base semiconductor chip at a diffusion joining temperature $T_D$ of $250°~C. \leq T_D \leq 400°~C.$ in a forming gas atmosphere. At this diffusion joining temperature $T_D$, the semiconductor chip to be stacked is preferably pressed onto the base semiconductor chip with a high mechanically applied compressive pressure $D_K$ of $0.1~MPa \leq D_K \leq 5~MPa$.

An alternative method for establishing such a connection would be the conventional "die bonding process", the base component comprising a semiconductor chip or a semiconductor wafer being located on a heated leadframe or on a semiconductor wafer carrier at temperatures of between 200° C. and 400° C. Subsequently, the component to be stacked is pressed with the pressure specified above onto the base component in the form of a semiconductor chip or semiconductor wafer. The material diffusion thereby taking place between the Sn/Au on the rear side of the upper component and the Pd/Au on the upper side of the base component has the effect that intermetallic phases form. In other words, preferably, an Au/Sn/Pd layer of the atomic composition $Au_2Sn_3Pd$, which after they have formed, cooled and solidified isothermally, ensures a mechanically stable and thermally and electrically highly conductive connection between the components joined in this way of a power semiconductor device.

A diffusion joining structure is provided which comprises lead-free solders, preferably one of the multicomponent systems with Sn—Ag alloys or In—Ag alloys or Au—Sn alloys with reservoirs in the form of Ag, Cu or Ni layers, are used as the diffusion joining materials.

In one embodiment, the diffusion joining structure comprises a buildup of layers that is deposited on a side of a first component. The first buildup or sequence of layers comprises a copper layer with a thickness $d_{Cu}$ in micrometers of 10 µm$\leq d_{Cu}\leq$20 µm, a nickel/phosphorus layer with a phosphorus content $V_{Ph}$ of 3% by volume$\leq V_{Ph}\leq$8% by volume and a thickness $d_{NiP}$ of 2 µm$\leq d_{NiP}\leq$5 µm, a palladium layer (Pd) with a thickness $d_{Pa}$ in nanometers of 100 nm$\leq d_{Pa}\leq$500 nm and a gold layer (Au) with a thickness $d_G$ of 40 nm$\leq d_G\leq$100 nm, wherein the copper layer is applied first, i.e., the copper layer is disposed on the side of the component, and wherein the gold layer is applied at the end, i.e., the gold layer is disposed on the palladium layer.

The component may be a chip carrier of an electronic component onto which a second component is to be joined. The second component may be a semiconductor device. If the chip carrier comprises copper the copper layer of the diffusion joining structure may be provided by the uppermost region of the chip carrier.

In an embodiment, the diffusion joining structure comprises a second buildup or sequence of layers deposited on a side of a second component to be joined. The sequence comprises an aluminum layer (Al) with a thickness $d_{Al}$ in nanometers of 400 nm$\leq d_{Al}\leq$800 nm, a first titanium layer (Ti$_1$) with a thickness $d_{Ti1}$ of 400 nm$\leq d_{Ti1}\leq$800 nm, a nickel layer with a thickness $d_{Ni}$ of 50 nm$\leq d_{Ni}\leq$100 nm, a second titanium layer (Ti$_2$) with a thickness $d_{Ti2}$ of 2 nm$\leq d_{Ti2}\leq$5 nm, a silver layer (Ag) with a thickness $d_{Ag}$ of 100 nm$\leq d_{Ag}\leq$1000 nm and a gold/tin layer (AuSn) with 80Au/20Sn and a thickness $d_{GSn}$ in micrometers of 0.9 µm$\leq d_{GSn}\leq$2.0 µm, wherein the aluminum layer (Al) is applied first, i.e., the aluminium layer (Al) is applied on the side of component, and the gold/tin layer (AuSn) is applied at the end, i.e., the gold/tin layer (AuSn) is applied on the silver layer (Ag).

The second component may be one selected from the group including: a semiconductor chip, a semiconductor wafer and a power semiconductor device. The aluminium layer is positioned directly on the semiconductor material of the semiconductor chip, wafer or power device and provides an ohmic contact to the semiconductor chip, semiconductor wafer or semiconductor power device.

The first and second components may be joined to one another via the first and second sequences of layers to produce a diffusion joint.

An electronic component comprising a semiconductor chip mounted on a chip carrier by a diffusion solder joint. The diffusion solder joint comprises an aluminum layer (Al) with a thickness $d_{Al}$ in nanometers of 400 nm$\leq d_{Al}\leq$800 nm positioned on the semiconductor chip, a first titanium layer $d_{Ti1}$ of 400 nm$\leq d_{Ti1}\leq$800 nm, a nickel layer with a thickness $d_{Ni}$ of 50 nm$\leq d_{Ni}\leq$100 nm, a second titanium layer (Ti$_2$) with a thickness $d_{Ti2}$ of 2 nm$\leq d_{Ti2}\leq$5 nm, a silver layer (Ag) with a thickness $d_{Ag}$ of 100 nm$\leq d_{Ag}\leq$1000 nm a layer with intermetallic phases (11) of the type Au$_3$Sn$_3$Pd, a palladium layer (Pd) with a thickness $d_{Pa}$ in nanometers of 100 nm$\leq d_{Pa}\leq$500 nm, a nickel/phosphorus layer with a phosphorus content $V_{Ph}$ of 3% by volume$\leq V_{Ph}\leq$8% by volume and a thickness $d_{NiP}$ of 2 µm$\leq d_{NiP}\leq$5 µm, and a copper layer with a thickness $d_{Cu}$ in micrometers of 10 µm$\leq d_{Cu}\leq$20 µm.

The copper layer may be positioned on the chip carrier or may comprise the uppermost surface region of the chip carrier if the chip carrier comprises copper.

In the following paragraphs, exemplary embodiments of the method are described in connection with the figures.

Figure 1:
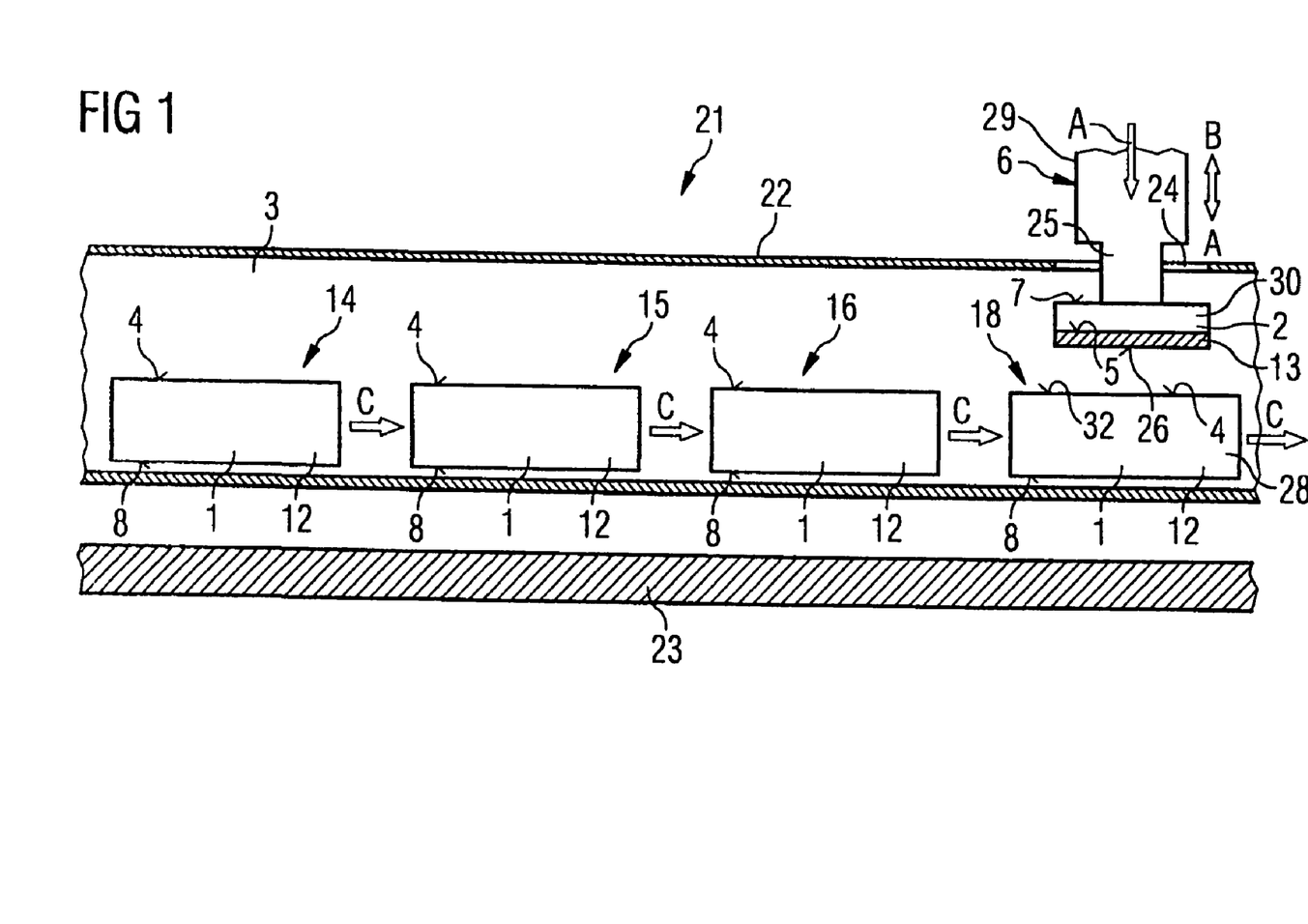
FIG. 1 shows a schematic basic diagram of an apparatus for carrying out the method according to an exemplary implementation.

FIG. 1 shows a schematic basic diagram of an apparatus 21 for carrying out the joining method according to an exemplary implementation. The apparatus 21 has a flow-through furnace 22 with internal flow-through positions 14, 15, 16 and 18, an external resistance heater 23 heating the flow-through furnace 22. In this example of implementation, a forming gas of H$_2$/N$_2$ with 5% by volume is passed through the flow-through furnace 22. This forming gas reduces an upper side 4 to be joined of a base component 1, which, in this case for example, comprises a copper heat sink of a power semiconductor device, and consequently cleans the upper side 4 in the positions 14, 15 and 16 before diffusion joining. For this purpose, the resistance heater 23 heats up the base component to temperatures of between 200 and 400° C. This temperature depends on the melting temperature of the lowest-melting metal component of a sequence of layers to be joined. The copper heat sink thereby passes through the flow-through furnace 22 in a direction of the arrow C.

In a joining position 18 of the horizontally aligned flow-through furnace 22, a second component 2, which in this embodiment represents, for example, a power semiconductor chip 30, is applied with the aid of a tool 6 via a vertical access 24. The tool 6, e.g., a vacuum pipette 29, holds the component 2, e.g., a power semiconductor chip 30, to be joined on an upper side 7 of the component 2. The tool 6 includes a large-area mouthpiece 25, against which the upper side 7 is pressed via the action of the vacuum pipette 29. The power semiconductor chip 30 includes on a rear drain electrode a sequence of layers with diffusion joining material 13, which enters into a metallic connection with the upper side 4 of the copper heat sink of the base component 1 of the power semiconductor device by diffusion joining.

For this purpose, the sequence of layers of diffusion joining material 13 is applied to the rear side of a semiconductor wafer before the semiconductor wafer is divided into individual power semiconductor chips 30. Consequently, a surface 26 includes the sequence of layers of the diffusion material 13 on a rear side 5 of the power semiconductor chip 30 in a uniform and planar state up to the corners and edges of the power semiconductor chip. Consequently, the risk of corners and edge sides of the power semiconductor device to be joined not being wetted can be reduced in comparison with the conventional joining process, as it is shown in FIG. 9. Furthermore, the void rate is less than 5% in the case of this embodiment of the joining method.

In the joining position 18, after alignment of the power semiconductor chip 30 with its diffusion joining material 13 on the rear side 5, the tool 6 is lowered in a direction of the arrow A and pressed onto the upper side 4 of the base component 1, e.g., a copper heat sink, of a power semiconductor device. Simultaneously, a mechanical compressive pressure $D_K$ of 0.1 MPa$\leq D_K\leq$5 MPa is exerted on the components to be joined, which are supported with a rear side 8 of the base component in the flow-through furnace 22. This high mechanical compressive pressure has the effect that an excess of low-melting material is pressed out from the forming diffusion joint, and a layer of intermetallic phases between 0.5 and 2 µm thick forms in the diffusion joint in a few seconds. Consequently, the diffusion joint achieves a heat resistance which is higher than the process temperature reached by the resistance heater 23. Even after a few seconds, the compression tool 6 can be removed from the access opening 24 in a direction of the arrow B. Subsequent to the removal of the tool 6 from the upper side 7 of the power semiconductor chip 30, the components 1 and 2, with a high-temperature-resistant diffusion joint, are led out from the flow-through furnace 22 in the direction of the arrow C.

Figure 2:
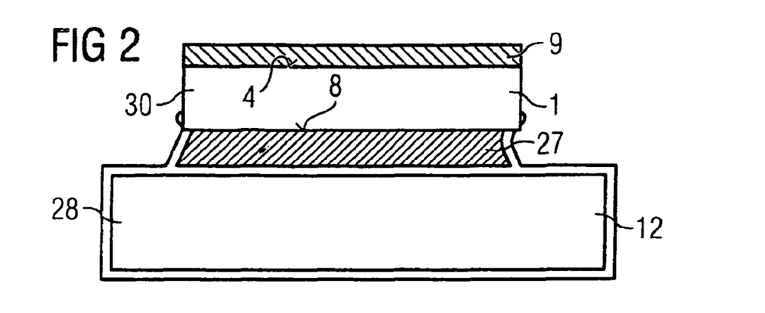
FIG. 2 shows a schematic cross section through a circuit carrier with an applied base component.

FIG. 2 shows the result of the joining method shown in FIG. 1.

Figure 3:
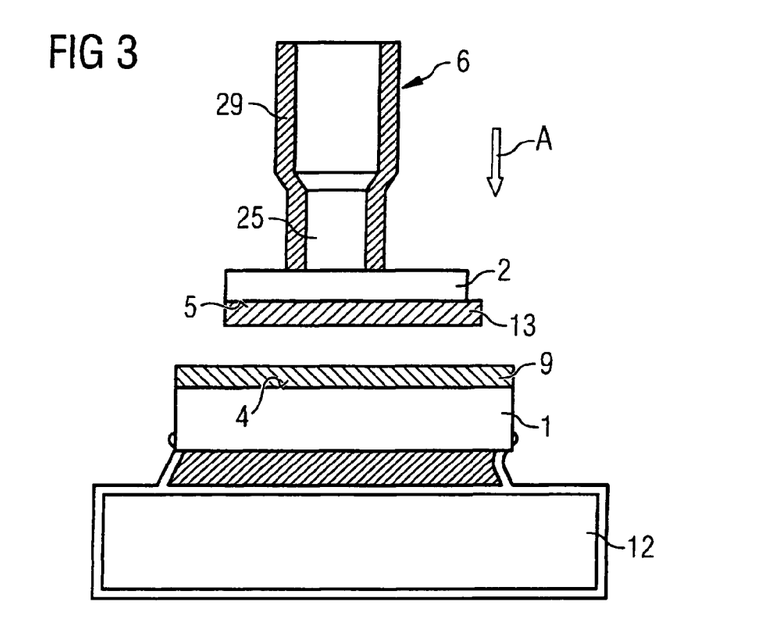
FIG. 3 shows a cross section through the circuit carrier according to FIG. 2 after aligning a component to be joined over the base component.
Figure 4:
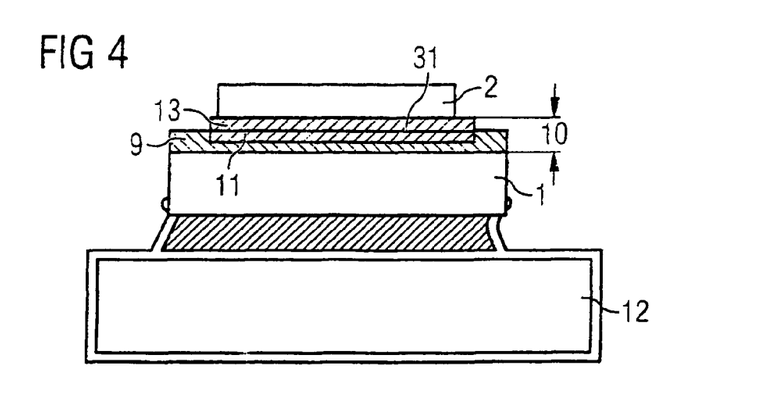
FIG. 4 shows a cross section through the circuit carrier according to FIG. 3 after joining the component to be joined on the base component.

FIGS. 2 to 4 show schematic cross sections through components 1 and 12 when joining a further component 2 to be joined on the previously joined component 1.

FIG. 2 shows a schematic cross section through a leadframe 12 with an applied base component 1. The soldered joint 27 may comprise a diffusion joint, which is obtained by diffusion joining between the leadframe 12 in the form of a copper heat sink 28 and a power semiconductor chip 30, as shown by FIG. 1 in the joining position 18.

A sequence of layers of a diffusion joining material 9 is then applied to the base component 1 then present in the form of a power semiconductor chip 30. However, this diffusion joining material 9 may already be applied when producing the power semiconductor chip 30 in individual semiconductor chip positions of a semiconductor wafer. This stack comprising a circuit carrier 12 and a first base component 1 of a power semiconductor device can then be introduced once again into an apparatus for joining, as shown by FIG. 1, and joined together with a further semiconductor chip in the joining position 18.

FIG. 3 shows a cross section through the circuit carrier 12 according to FIG. 2, after aligning a component 2 to be joined over the base component 1. For this purpose, the component 2 to be joined is held by a vacuum pipette 29 and aligned with its diffusion joining material 13 on the rear side 5 over the upper side 4 of the base component 1 with diffusion joining material 9 and lowered in the direction of the arrow A. This takes place, as FIG. 1 shows, in a reducing atmosphere 3, which keeps the upper sides of the sequences of layers to be joined free from oxides. Meanwhile, the components are heated up in the reducing atmosphere 3 to a process temperature of between 200 and 400° C.

FIG. 4 shows a cross section through the circuit carrier 12 according to FIG. 3, after joining of the component 2 to be joined on the base component 1. This produces a diffusion joint 10, which in a few seconds forms intermetallic phases 11 in the boundary surface region 31 between the diffusion joining materials 13 and 9 under the contact pressure of the component 2 to be joined with the aid of the compression tool 6. In this case, a compressive pressure $D_K$ of between 0.1 and 5 MPa is exerted on the components 1 and 2 to be joined.

Figure 5:
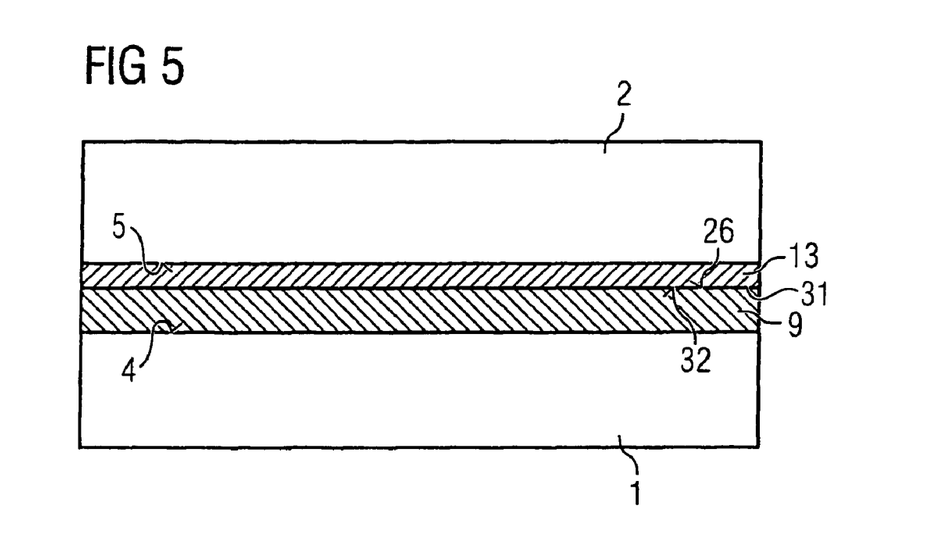
FIG. 5 shows a schematic basic diagram after placement of a component to be joined onto a base component.

FIG. 5 shows a schematic basic diagram after placement of a component 2 to be joined onto a base component 1. In this case, the stack comprising the components 1 and 2 may be used for so-called "face-to-face" technology (power semiconductor chip on semiconductor wafer), for "chip on chip" technology, for "chip on substrate" (semiconductor chip on a circuit carrier) technology and/or for "flip chip" technology.

In order to avoid excesses of molten components during the diffusion soldering, the sequences of layers of the diffusion material on the upper side 4 of the base component 1 and the diffusion joining material 13 on the rear side 5 of the component 2 to be joined include a precise given sequence of material and, within the sequence of material, a given layer thickness that is to be precisely maintained within limits. To be specific, for this purpose the sequence of layers of the diffusion material 9 on the base component 1, the sequence of layers includes the following buildup of layers.

Unless the component 1 itself comprises copper, deposited directly on the upper side 4 of the base component 1 there is a copper layer with a thickness $d_{Cu}$ in micrometers of 10 $\mu m \leq d_{Cu} \leq 20$ $\mu m$. Arranged on it is a nickel/phosphorus layer with a phosphorus content $V_{Ph}$ of 3% by volume $\leq V_{Ph} \leq 8\%$ by volume, which has a thickness $d_{NiP}$ of 2 $\mu m \leq d_{NiP} \leq 5$ $\mu m$. Arranged on this nickel/phosphorus layer is a palladium layer (Pd) with a thickness $d_{Pa}$ in nanometers of 100 nm $\leq d_{Pa} \leq 500$ nm. Finally, the surface 32 of the diffusion material 9 includes a gold layer Au with a thickness $d_G$ of 40 nm $\leq d_G \leq 100$ nm. This sequence of layers was applied over a large area to the base component before the components 1 and 2 to be joined were brought together.

The sequence of layers of the diffusion joining material 13 of the component 2 to be joined, which has a semiconductor material on its rear side 5, has the following layers of metal. Firstly, applied on the rear side 5 of the semiconductor is an aluminum layer Al with a thickness $d_{Al}$ in nanometers of 400 nm $\leq d_{Al} \leq 800$ nm. Deposited on this aluminum layer Al is a first titanium layer $Ti_1$ with a thickness $d_{Ti1}$ of 400 nm $\leq d_{Ti1} \leq 800$ nm. Deposited on it is a nickel layer with a thickness $d_{Ni}$ of 50 nm $\leq d_{Ni} \leq 100$ nm and a second titanium layer $Ti_2$ with a thickness $d_{Ti2}$ of 2 nm $\leq d_{Ti2} \leq 5$ nm. Deposited on the second titanium layer $Ti_2$ is a silver layer Ag with a thickness $d_{Ag}$ of 556 nm. The surface 26 of the diffusion material 13 on the rear side 5 of the component 2 to be joined is finished off, i.e., topped, by a gold/tin layer AuSn with a composition of 80Au/20Sn and a thickness $d_{GSn}$ in micrometers of 0.9 $\mu m \leq d_{GSn} \leq 2.0$ $\mu m$.

Consequently, when the component 2 to be joined is mechanically pressed onto the base component 1, in the boundary layer region 31 a gold/palladium sequence of layers of the diffusion material 9 of the base component 1 meets a gold/tin layer of the component 2 to be joined. Under an appropriate compressive pressure, intermetallic phases thereby form, as already mentioned above.

Figure 6:
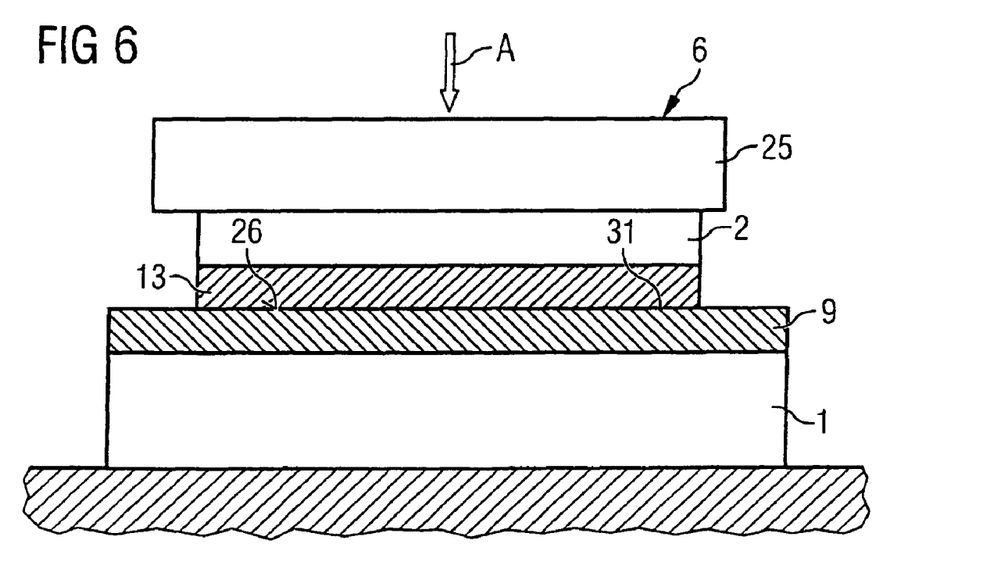
FIG. 6 shows a schematic basic diagram after placement of a compression tool onto the stacked components.

FIG. 6 shows a schematic basic diagram after placement of a compression tool 6 with its mouthpiece 25 onto the stacked components 1 and 2. This compression tool 6 presses with its mouthpiece 25 over a large area in the direction of the arrow A onto the stack comprising the base component 1 and the component 2 to be joined, with diffusion materials 9 and 13 arranged in between. At the same time, the tool 6 ensures by appropriate vacuum openings, such as a vacuum pipette, that the component 2 to be joined is releasably held on the mouthpiece 25 of the tool 6.

A tilting of the component 2 to be joined in the boundary region 31 of the two sequences of layers of the diffusion joining materials 9 and 13 is prevented on one hand by the planarity of the surfaces 26 and 32. The planarity is retained even when the diffusion phases form at process temperature, since there is no melt drop arranged between the components 1 and 2 to be joined, as there is in the conventional method. In addition, a thick melt bath between the diffusion materials 9 and 13 to be joined is avoided by the layer thicknesses and sequences of layers specified above being precisely maintained, such that no instances of tilting can occur.

Figure 7:
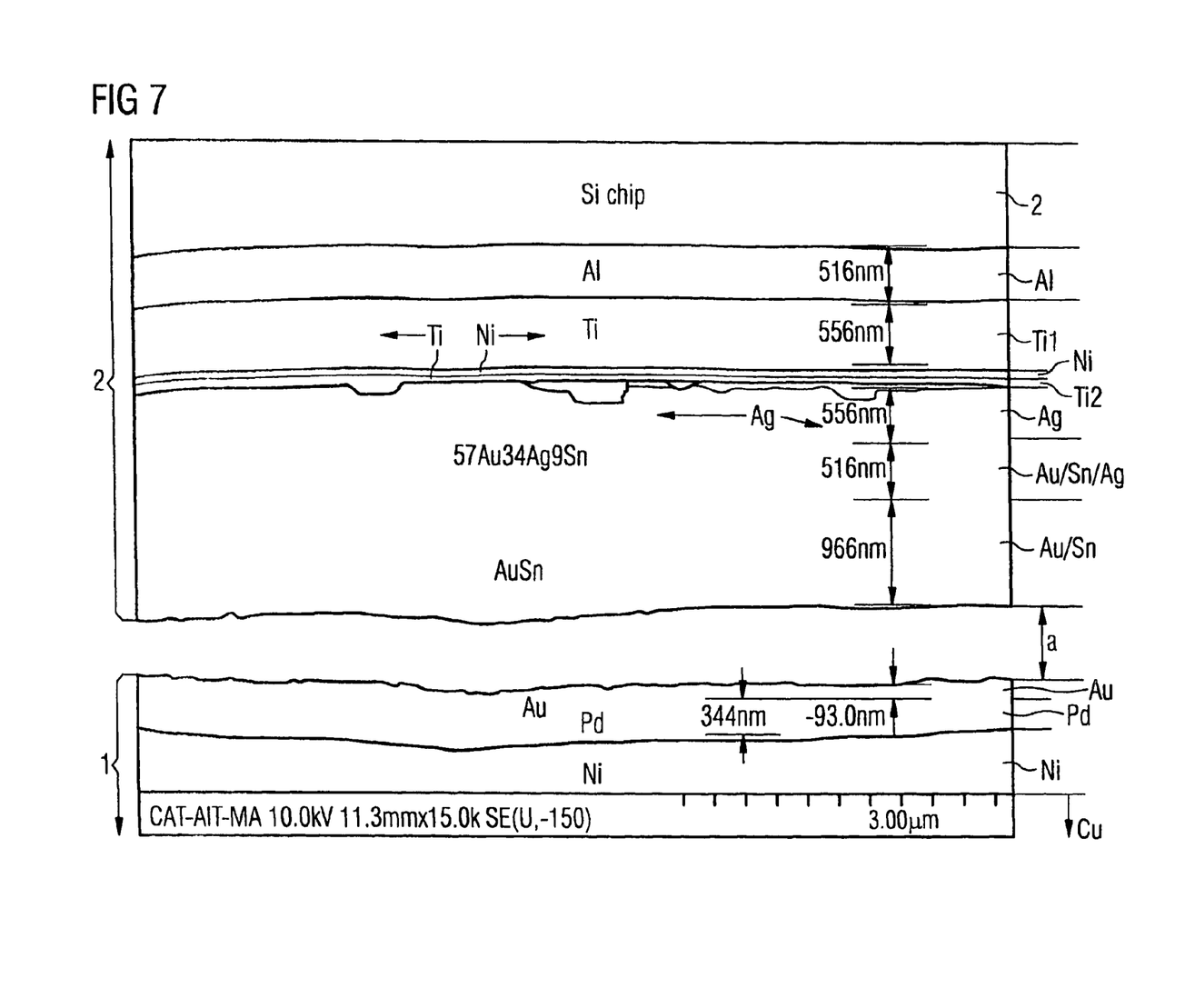
FIG. 7 shows a scanning electron microscope photo of the sequence of layers of a base component and a component to be joined.

FIG. 7 shows a scanning electron microscope photo of the sequence of layers of a base component 1 and a component 2 to be joined, which are within a distance a of already lying one on top of the other. In this respect, the complete sequence of layers of a silicon chip is shown as the component 2 to be joined, with the layer thicknesses produced. Arranged on the rear side 5 of the silicon chip 2 is an aluminum layer of 516 nm, which corresponds to the thickness range, specified above. The aluminum layer Al is followed by a first titanium layer $Ti_1$ with 556 nm and a sequence of layers comprising a thin nickel layer of a few nanometers and, deposited on the thin nickel layer, a second titanium layer $Ti_2$, likewise of a few nanometers in the thickness range as already specified above.

This is followed in a number of stages by a sequence of layers comprising a pure silver layer with a thickness of 556 nm and a layer composition comprising 57Au/34Ag/9Sn in a thickness of 516 nm at the transition to an AuSn layer with a thickness of the order of magnitude of 966 nm. Of the sequence of layers deposited on the base component 1, in this scanning electron microscope photo there can only be seen the nickel layer, following on from which is a palladium layer with a layer thickness of 344 nm and a gold layer with a thickness of 93 nm.

Figure 8:
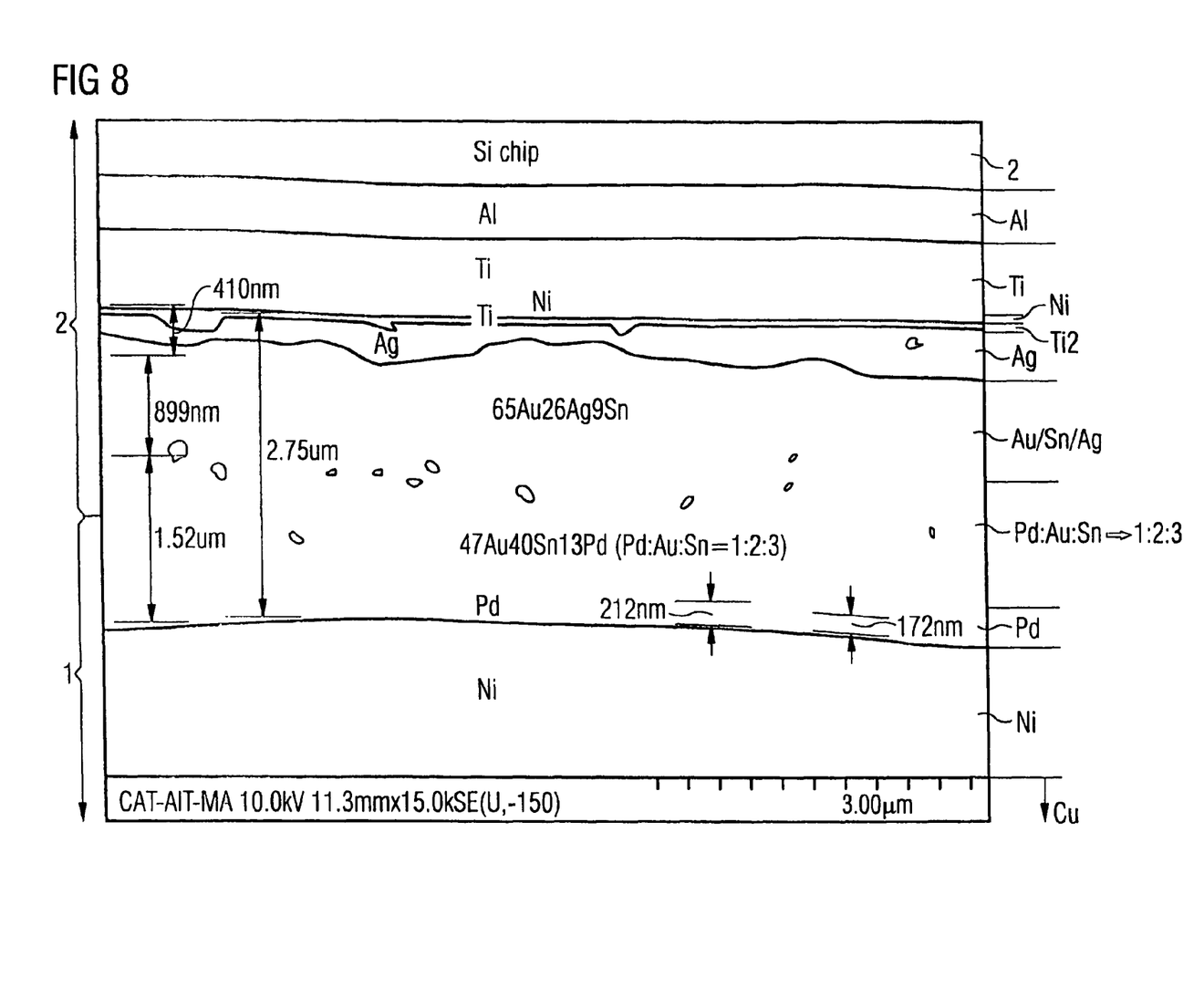
FIG. 8 shows a scanning electron microscope photo of the sequence of layers of a diffusion joint after joining the sequence of layers according to FIG. 7.

FIG. 8 shows a scanning electron microscope photo of the sequence of layers of a diffusion joint 10 after joining the sequences of layers according to FIG. 7. In this case, the layers Al, $Ti_1$ and Ni and $Ti_2$ remain unchanged in their sequence and thickness, while the then following silver layer of the transition layer Au/Ag/Sn changes significantly in its composition, and finally forms with the palladium/gold layer of the base component 1 a layer with a thickness of 1.25 µm, which preferably has the intermetallic phase Pd:Au:Sn in the ratio 1:2:3.

In this case, the gold layer on the base component 1 is completely consumed, so that the layer comprising intermetallic compounds lies directly on the palladium layer, provided that the palladium has not been completely consumed in the formation of the intermetallic phase. The nickel layer is similarly retained as a diffusion-inhibiting layer of the base component, as is the sequence of layers comprising titanium and nickel on the rear side of the silicon chip, which represents a diffusion barrier for the aluminum arranged on the rear side of the silicon chip.

While the method has been described in detail with reference to specific embodiments thereof, it will be apparent to one of ordinary skill in the art that various changes and modifications can be made therein without departing from the spirit and scope thereof. Accordingly, it is intended that the described method covers the modifications and variations of this method provided they come within the scope of the appended claims and their equivalents.

What is claimed is:

1. A method for the planar joining of components of semiconductor devices, the method comprising:
    providing the components of semiconductor devices that are to be joined, the components including a component with a rear side and a base component with an upper side, wherein the upper side of the base component is to be joined with the rear side of the component;
    applying layers of joining material to at least one of: the upper side of the base component and the rear side of the component to be joined, the layers being applied to at least one of: individual components of semiconductor devices, semiconductor wafers including a plurality of individual components of semiconductor devices, and semiconductor chip carriers including a plurality of individual components of semiconductor devices;
    introducing the components to be joined into a reducing atmosphere such that the rear side of the component is disposed above the upper side of the base component;
    aligning the components to be joined;
    applying compressive pressure to the aligned components; and
    heating the compressed components in the reducing atmosphere to a diffusion joining temperature for isothermal solidification of the joining material thereby forming a diffusion joint, wherein:
        the diffusion joining temperature is below a melting temperature of the diffusion joint; and
        applying layers of joining material to the rear side of the component comprises:
            depositing a buildup of layers including:
                an aluminum layer;
                a first titanium layer;
                a nickel layer;
                a second titanium layer;
                a silver layer; and
                a gold/tin layer with 80Au/20Sn;
            wherein the aluminum layer is applied to the component and the gold/tin layer is applied to the silver layer.

2. The method as claimed in claim 1, wherein applying layers of joining material includes applying a diffusion-inhibiting layer, and wherein the diffusion joint includes the diffusion-inhibiting layer that is a diffusion barrier of the upper side of the base component or the rear side of the joined component.

3. The method as claimed in claim 2, wherein the compressive pressure is exerted over a full surface area of the aligned components to be joined.

4. The method as claimed in claim 2, wherein the compressive pressure is applied via a mechanically and thermally stable tool.

5. The method as claimed in claim 2, wherein the compressive pressure is applied via a clamp including:
    a first leg;
    a second leg, the clamp being arranged with the first leg being flat on an upper side of the component and with the second leg being flat on a rear side of the base component; and
    a spring element region with a thermally stable spring, the spring element region being disposed between the first and second legs, wherein the thermally stable spring constantly presses the legs of the clamp one against the other.

6. The method as claimed in claim 2, further comprising:
    pressing out excess material from the diffusion joint between the components being joined, the excess material having a melting point that is lower than the melting point of the diffusion joint.

7. The method as claimed in claim 2, wherein applying compressive pressure to the aligned components thereby reduces a diffusion joining time to a few seconds.

8. The method as claimed in claim 2, wherein the diffusion joint is formed with a layer with intermetallic phases between the diffusion joining materials; wherein a thickness of the diffusion joint corresponds to the sum of a thickness of the intermetallic phases and thicknesses of the layers of the joining materials having melting points that lie above the diffusion joining temperature.

9. The method as claimed in claim 8, wherein the layer of intermetallic phases is formed with a thickness $d_f$, where $1 \mu m \leq d_f \leq 1.5 \mu m$.

10. The method as claimed in claim 2, wherein the component is a semiconductor chip and wherein the base component is a semiconductor chip position of a semiconductor wafer.

11. The method as claimed in claim 10, wherein the semiconductor chip is a power semiconductor chip and wherein the semiconductor wafer is highly doped.

12. The method as claimed in claim 11, wherein the power semiconductor chip is thinned.

13. The method as claimed in claim 2, wherein the component and the base component are power semiconductor chips.

14. The method as claimed in claim 2, wherein the component is a power semiconductor chip and wherein the base component is a circuit carrier.

15. The method as claimed in claim 2, wherein the component is a semiconductor chip and wherein the base component is a central chip plane of a leadframe.

16. The method as claimed in claim 2, wherein applying layers of joining material to at least one of: the upper side of the base component and the rear side of the component to be joined, further comprises:
coating a rear side of a semiconductor wafer via a thin-film depositing method.

17. The method as claimed in claim 2, wherein the diffusion joining temperature is $T_D$, where $250°\, C. \leq T_D \leq 400°\, C$.

18. The method as claimed in claim 2, wherein the reducing atmosphere is a forming gas atmosphere of $H_2N_2$ with 5% by volume of hydrogen in nitrogen.

19. The method as claimed in claim 2, wherein the compressive pressure is $D_K$, where $0.1\, MPa \leq D_K \leq 5\, MPa$.

20. A method for the planar joining of components of semiconductor devices, the method comprising:
providing the components of semiconductor devices that are to be joined, the components including a component with a rear side and a base component with an upper side, wherein the upper side of the base component is to be joined with the rear side of the component;
applying layers of joining material to at least one of: the upper side of the base component and the rear side of the component to be joined, the layers being applied to at least one of: individual components of semiconductor devices, semiconductor wafers including a plurality of individual components of semiconductor devices, and semiconductor chip carriers including a plurality of individual components of semiconductor devices;
introducing the components to be joined into a reducing atmosphere such that the rear side of the component is disposed above the upper side of the base component;
aligning the components to be joined;
applying compressive pressure to the aligned components; and
heating the compressed components in the reducing atmosphere to a diffusion joining temperature for isothermal solidification of the joining material thereby forming a diffusion joint, wherein:
the diffusion joining temperature is below a melting temperature of the diffusion joint; and
applying layers of joining material to the rear side of the component comprises:
depositing a buildup of layers including:
an aluminum layer with a thickness $d_{Al}$, where $400\, nm \leq d_{Al} \leq 800\, nm$;
a first titanium layer with a thickness $d_{Ti1}$, where $400\, nm \leq d_{Ti1} \leq 800\, nm$;
a nickel layer with a thickness $d_{Ni}$, where $50\, nm \leq d_{Ni} \leq 100\, nm$;
a second titanium layer with a thickness $d_{Ti2}$, where $2\, nm \leq d_{Ti2} \leq 5\, nm$;
a silver layer with a thickness $d_{Ag}$, where $100\, nm \leq d_{Ag} \leq 1000\, nm$; and
a gold/tin layer with 80Au/20Sn and a thickness $d_{GSn}$, where $0.9\, \mu m \leq d_{GSn} \leq 2.0\, \mu m$;
wherein the aluminum layer is applied to the component and the gold/tin layer is applied to the silver layer.

\* \* \* \* \*